United States Patent
Asherman et al.

(10) Patent No.: US 6,384,748 B1
(45) Date of Patent: May 7, 2002

(54) METHOD OF ENCODING NUMERIC DATA AND MANIPULATING THE SAME

(75) Inventors: Steven Asherman; Arun Kumar, both of New York, NY (US)

(73) Assignee: Base One International Corporation, New York, NY (US)

( * ) Notice: Subject to any disclaimer, the term of this patent is extended or adjusted under 35 U.S.C. 154(b) by 0 days.

(21) Appl. No.: 09/434,693

(22) Filed: Nov. 5, 1999

Related U.S. Application Data

(60) Provisional application No. 60/113,176, filed on Dec. 21, 1998.

(51) Int. Cl.[7] ............................................. H03M 7/00
(52) U.S. Cl. ............................................. 341/83
(58) Field of Search ............................. 341/83, 50, 51; 382/232; 708/530

(56) References Cited

U.S. PATENT DOCUMENTS

| | | | |
|---|---|---|---|
| 5,267,186 A | 11/1993 | Gupta et al. | 708/508 |
| 5,612,909 A | 3/1997 | Morrow | 708/550 |
| 5,631,859 A | 5/1997 | Markstein et al. | 708/513 |
| 5,633,818 A | 5/1997 | Taniguchi | 708/551 |
| 5,671,170 A | 9/1997 | Markstein et al. | 708/500 |
| 5,768,170 A | 6/1998 | Smith | 708/504 |
| 5,796,644 A | 8/1998 | Jiang | 708/501 |
| 5,841,684 A | 11/1998 | Dockser | 708/625 |
| 5,842,224 A | 11/1998 | Fenner | 711/202 |
| 5,854,929 A | 12/1998 | Van Praet et al. | 717/5 |
| 5,872,730 A * | 2/1999 | Shevach | 708/530 |
| 6,289,128 B1 * | 9/2001 | Allen | 382/232 |

* cited by examiner

*Primary Examiner*—Brian Young
(74) *Attorney, Agent, or Firm*—Pitney, Hardin, Kipp & Szuch LLP

(57) ABSTRACT

Numeric data is encoded as a variable-length, NULL-terminated string. The first character of the string represents the sign of the numeric data, the second character of the string represents the exponent of the numeric data, the following characters represent the digits of the mantissa of the numeric data and the final character is a termination character.

87 Claims, 11 Drawing Sheets

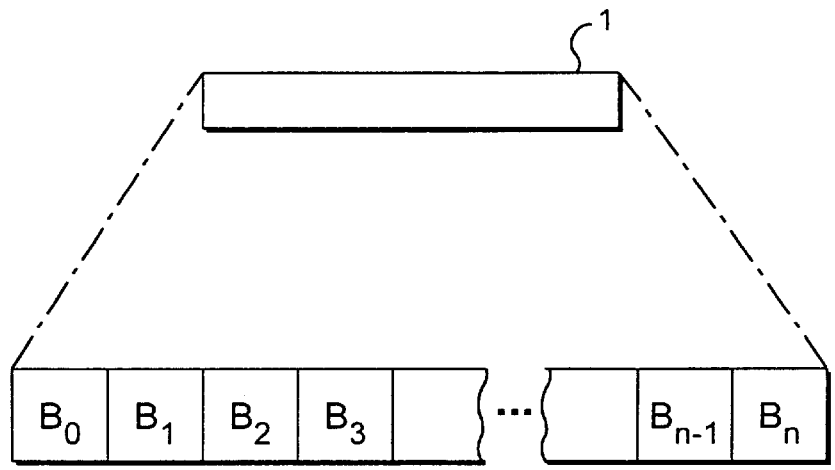
F I G. 1
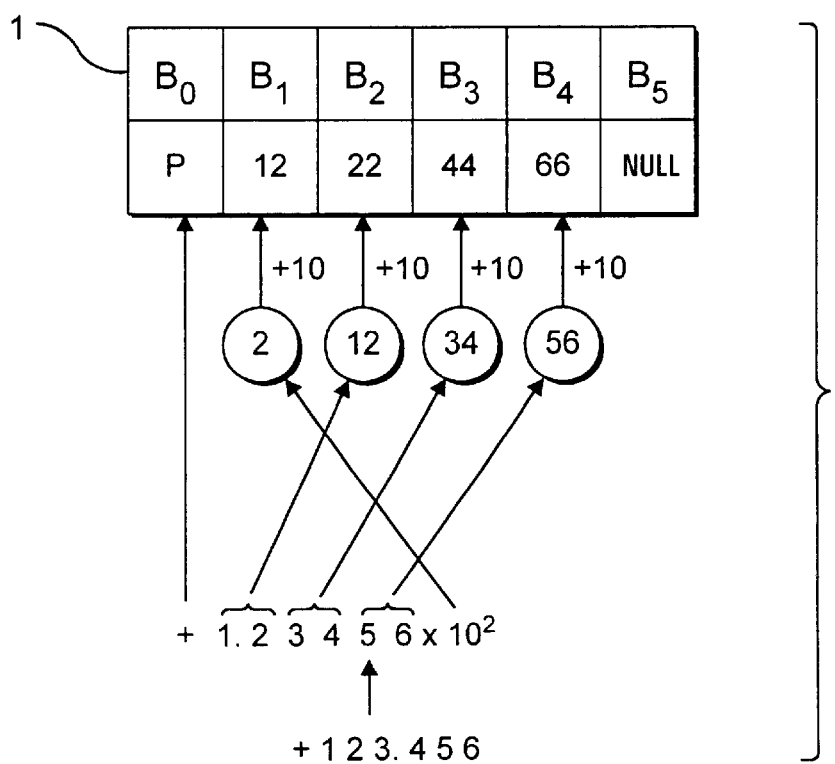
F I G. 2

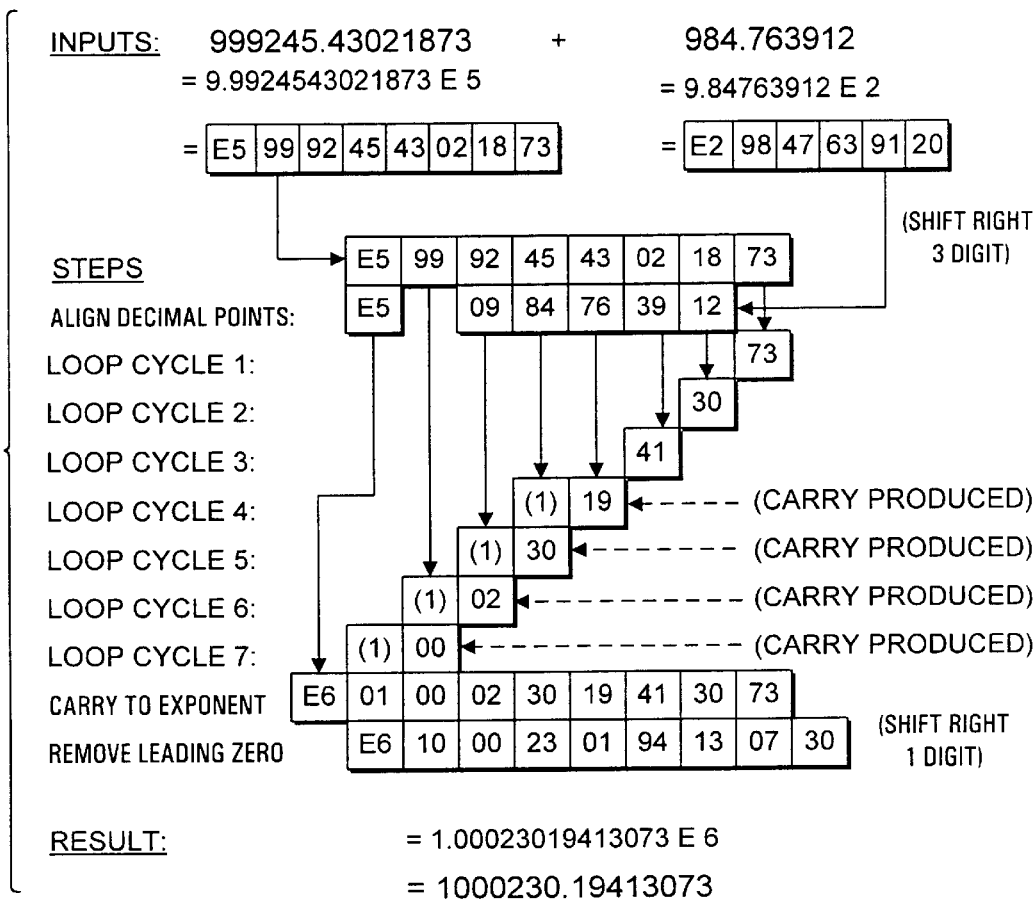
F I G. 7

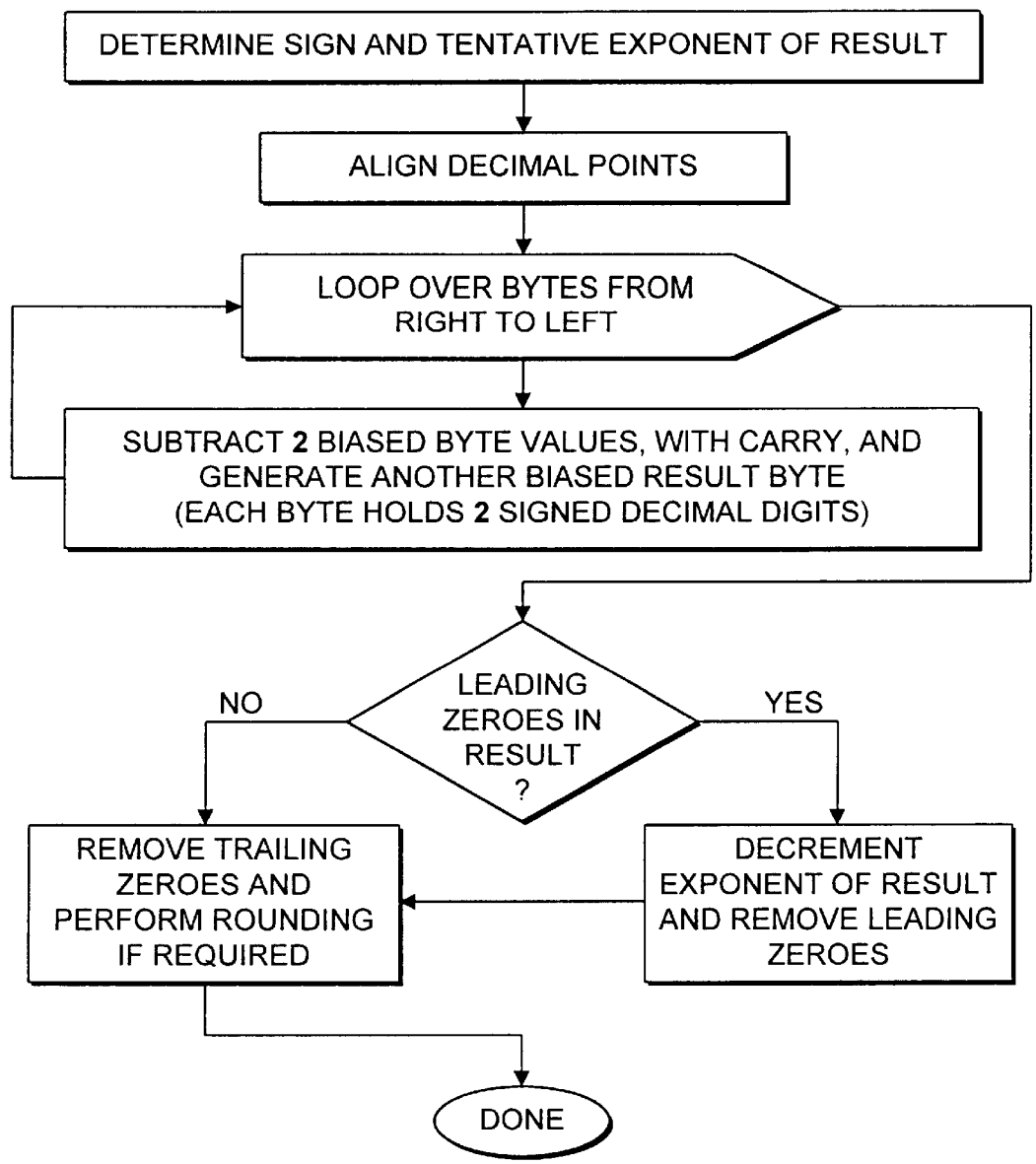
F I G. 8

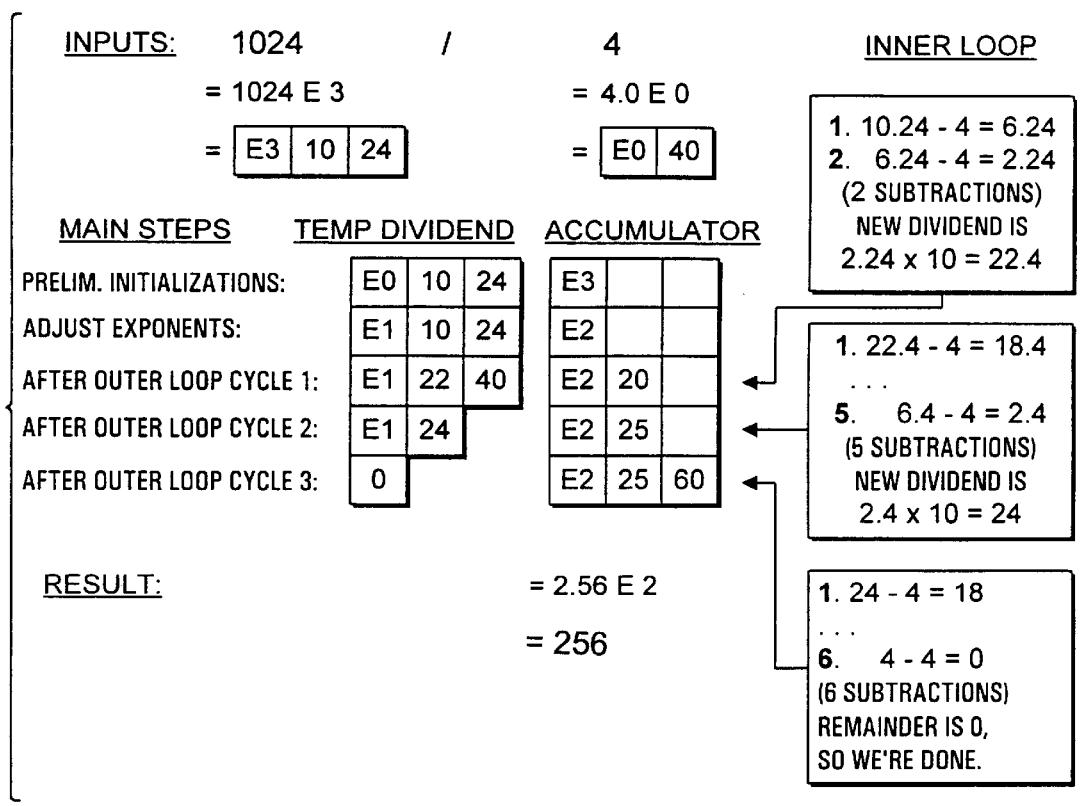
F I G. 13 ated on Dec. 21, 1998.

BACKGROUND OF THE INVENTION

1. Field of the Invention

The present invention relates generally to a method of encoding numeric data and manipulating the same. More particularly, the present invention relates to a method of encoding numeric data as a variable-length, null-terminated string and manipulating the variable-length, null-terminated string.

2. Description of the Prior Art

It is well known in the art to store numeric data as a fixed-length data type. For example, the C programming language defines three data types for storing numeric data, namely, "int," "float" and "double." An additional data type, "char," is used for storing characters. A fixed amount of memory is allocated to each of these data types, and, therefore, a finite range of values is associated with each data type. Furthermore, each of these data types may be modified by one or more of the modifiers "short," "long," "signed" and "unsigned," which further define the memory allocated and the range. For a modern personal computer ("PC"), Table 1, below, summarizes the memory allocation and range for several of the data types described above:

TABLE 1

| Data Type | Bytes | Range |
|---|---|---|
| int | 4 | −2,147,483,648 to +2,147,483,648 |
| short int | 2 | −32,768 to +32,767 |
| unsigned short int | 2 | 0 to 65,535 |
| unsigned int | 4 | 0 to +4,294,967,295 |
| float | 4 | $3.4 \times 10^{-38}$ to $3.4 \times 10^{38}$ (7 digits of precision) |
| double | 8 | $1.7 \times 10^{-308}$ to $1.7 \times 10^{308}$ (15 digits of precision) |
| long double | 10 | $1.2 \times 10^{-4932}$ to $1.2 \times 10^{4932}$ (19 digits of precision) |
| char | 1 | −128 to +127 |
| unsigned char | 1 | 0 to 255 |

Insofar as the foregoing data types have defined limitations in terms of memory allocation and range, the use of such data types requires a programmer to anticipate the range of the data intended to be stored therein. This is not always possible. Additionally, any range anticipated may be accurate at the time that software is authored, but the range may change over time.

Storage of very large or very small numbers having very few significant digits results in highly inefficient memory usage. Additionally, performing mathematical operations on variables having dissimilar data types may result in unexpected and unforeseeable errors. Without proper trapping and handling, these errors may be silently compounded.

SUMMARY OF THE INVENTION

It is an object of the present invention to provide a method of encoding numeric data and manipulated the encoded numeric data. It is a further object of the present invention to efficiently store numeric data. It is a further object of the present invention to provide a method of encoding numeric data which permits such data to be manipulated as conventionally stored numeric data. It is a still further object of the present invention to provide a method of encoding numeric data that can be sorted according to conventional sorting routines.

These and other beneficial objects of the present invention are most effectively attained by providing a method of encoding a numeric data as a variable-length, NULL-terminated string, wherein the first byte represents a sign of the numeric data, the second byte represents an exponent of the numeric data and the following bytes represent a mantissa of the numeric data. Each of the bytes, except for the first byte, is biased to avoid storage of a zero or NULL byte, which, according to the present invention is a terminating value. The first byte, in addition to indicating the sign of the numeric data, indicates whether the numeric data has a zero value or a NULL value, which is generally not recognized in standard computer programming languages, such as C.

BRIEF DESCRIPTION OF THE DRAWINGS

In the accompanying drawings:

FIG. 1 is a schematic view of a memory segment for storing numeric data;

FIG. 2 illustrates the encoding method according to the present invention, wherein the numeric data encoded is a positive number greater than 1;

FIG. 7 illustrates the addition operation performed on encoded numeric data;

FIG. 8 is a flow chart showing a subtraction operation of the present invention;

FIG. 13 illustrates the division operation performed on encoded numeric data.

DETAILED DESCRIPTION OF THE PREFERRED EMBODIMENTS

Figure 3:
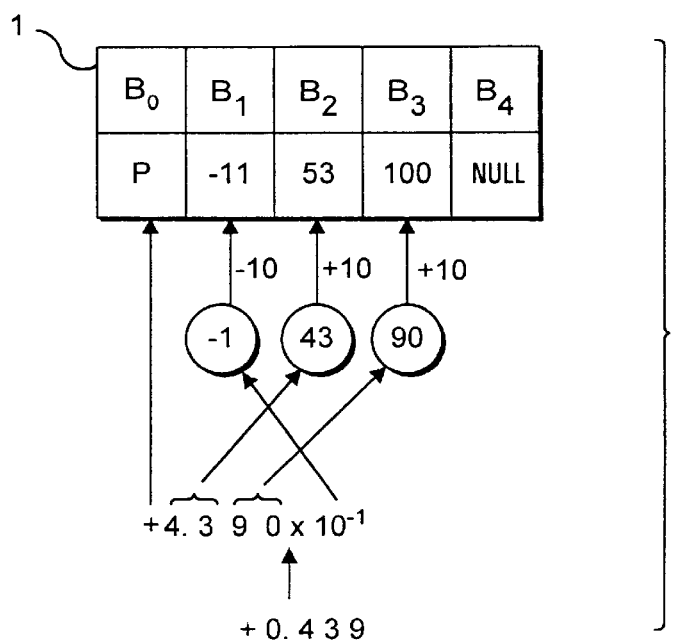
FIG. 3 illustrates the encoding method according to the present invention, wherein the numeric data encoded is a positive number less than 1.

Those skilled in the art will gain an appreciation of the present invention when viewed in conjunction with the accompanying drawings of FIGS. 1 to 13, inclusive. The individual reference characters designate the same or similar elements throughout the several drawings.

Referring to FIG. 1, there is seen a schematic view of a memory segment 1 for storing a numeric data. The memory segment 1 stores the numeric data as a null-terminated string. Memory segment 1 includes a number, n, of discrete memory units $B_0 \ldots B_n$. Preferably, each of the discrete memory units $B_0 \ldots B_n$ represents one byte of data. According to the present invention, one of the discrete memory units $B_0 \ldots B_n$ represents the sign of the numeric data stored in memory segment 1, and another one of the discrete memory units $B_0 \ldots B_n$ represents an exponent of the numeric data. The remaining discrete memory units represent the mantissa of the numeric data, and is terminated by a NULL byte.

Preferably, discrete memory unit $B_0$ represents the sign of the numeric data. More particularly, discrete memory unit $B_0$ contains one of four possible values: (1) 'n' if the numeric data is negative; (2) 'p' if the numeric data is positive; (3) 'o' if the numeric data has a zero value; or (4) "\0" (NULL) if the numeric data has a null value. $B_1$ represents the exponent of the numeric data and is biased to ensure that a NULL byte, which, according to the present invention, is a terminating byte, is not stored in $B_1$. $B_1$ is biased by either adding 10 to a positive exponent or subtracting 10 from a negative exponent. $B_2$ to $B_{n-1}$ represent the mantissa of the numeric data. Each of these discrete memory units $B_2 \ldots B_{n-1}$ represents two digits of the mantissa. The data stored in $B_2 \ldots B_{n-1}$ is biased by adding 10 to ensure that a NULL, terminating, byte is not stored in $B_2 \ldots B_{n-1}$. In the case of the numeric data being negative, the sign of each of $B_2 \ldots B_{n-1}$ is reversed. Finally, $B_n$ stores a NULL, terminating, byte.

The numeric data will take six forms: (1) a positive number greater than 1; (2) a positive number less than 1; (3) a negative number greater than −1; (4) a negative number less than −1; (5) zero; and (6) NULL. It will be appreciated that high-level computer programming languages, such as C or C++, do not provide for a variable containing NULL (a blank value), as distinct from a number having a value of zero. The encoding method of the present invention as applied to the six forms of the numeric data are addressed below in turn.

The encoding method of the present invention is described in further detail with reference to several examples of encoding numeric data. A first example of use of the encoding method of the present invention is shown in FIG. 2, wherein the numeric data is +123.456, or +1.23456×$10^2$. Since the numeric data is positive, 'p' is stored in $B_0$. The exponent of the numeric data is 2, which, when biased by adding 10, is stored in $B_1$ as 12. The mantissa is then segmented into three groups of two digits: 12, 34 and 56. The first group, 12, is biased by adding 10 and stored in $B_2$ as 22; the second group, 34, is biased by adding 10 and stored in $B_3$ as 44; and the third group, 56, is biased by adding 10 and stored in $B_4$ as 66. A NULL terminator is stored in $B_5$. Accordingly, the numeric data +123.456 is encoded as "p, 12, 22, 44, 66, NULL." Further examples of encoding positive numbers greater than 1 are shown below in Table 2:

TABLE 2

| Numeric Data | Encoded Numeric Data |
|---|---|
| +123 | "p, 12, 22, 40, NULL" |
| +12.3 | "p, 11, 22, 40, NULL" |
| +1.234 | "p, 10, 22, 44, NULL" |
| +1.23 | "p, 10, 22, 40, NULL" |

A second example of the use of the encoding method of the present invention is shown in FIG. 3, wherein the numeric data is +0.439, or +4.39×$10^{-1}$. As in the first example, the numeric data of the second example is positive, and, therefore, 'p' is stored in $B_0$. The exponent is −1, which when biased by subtracting 10, is stored in $B_1$ as −11. The mantissa is again segmented into groups of two digits: 43, 90. The first group, 43, is biased by adding 10 and stored in $B_2$ as 53; and the second group, 90, is biased by adding 10 and stored in $B_3$ as 100. Finally, the NULL terminator is stored in $B_4$. Accordingly, the numeric data +0.439 is encoded as "p, −11, 53, 100, NULL." Further examples of encoding positive numbers each less than 1 are shown below in Table 3:

TABLE 3

| Numeric Data | Encoded Numeric Data |
|---|---|
| +.43 | "p, −11, 53, NULL" |
| +.4 | "p, −11, 50, NULL" |
| +.123 | "p, −11, 22, 40, NULL" |
| +.0123 | "p, −12, 22, 40, NULL" |

Figure 4:
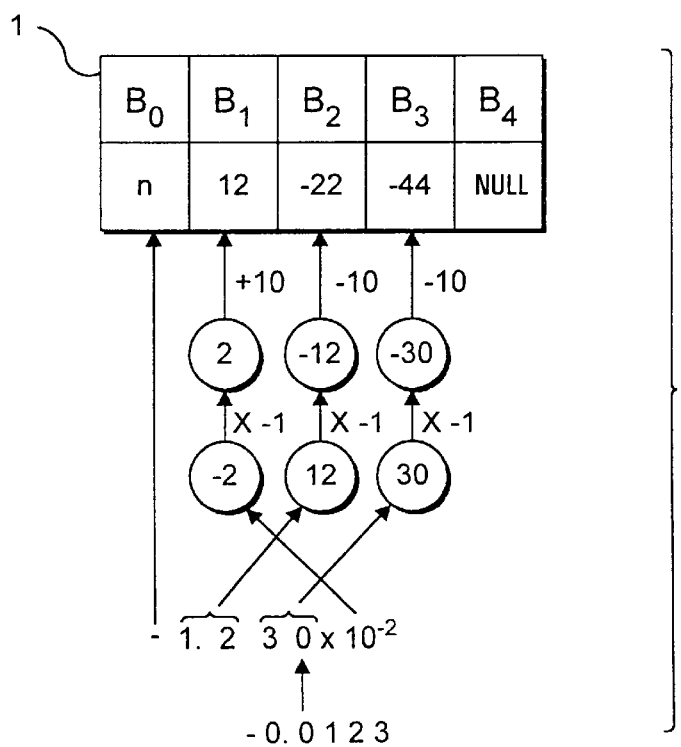
FIG. 4 illustrates the encoding method according to the present invention, wherein the numeric data encoded is a negative number greater than −1.

A third example of the use of the encoding method of the present invention is shown in FIG. 4, wherein the numeric data is −0.0123, or −1.23×$10^{-2}$. Because the numeric data is negative, 'n' is stored in $B_0$. The exponent is −2, which when biased by reversing the sign and adding 10 (or, equivalently, subtracting 10 and then reversing the sign) is stored in $B_1$ as 12. The mantissa is segmented into groups of two digits: 12, 30. The first group, 12, is biased by reversing the sign, because the numeric data is negative, and subtracting 10 (or, equivalently, adding 10 and then reversing the sign) and is stored in $B_2$ as −22; and the second group, 30, is biased by reversing the sign, because the numeric data is negative, and subtracting 10 (or, equivalently, adding 10 and then reversing the sign) and is stored in $B_3$ as −40. Finally, the NULL terminator is stored in $B_4$. Accordingly, the numeric data −0.0123 is encoded as "n, 12, −22, −40, NULL." Further examples of encoding negative numbers greater than −1 are shown below in Table 4:

TABLE 4

| Numeric Data | Encoded Numeric Data |
|---|---|
| −0.123 | "n, 11, −22, −40, NULL" |
| −0.4 | "n, 11, −50, NULL" |
| −0.42 | "n, 11, −52, NULL" |
| −0.43 | "n, 11, −53, NULL" |
| −0.439 | "n, 11, −53, −100, NULL" |

Figure 5:
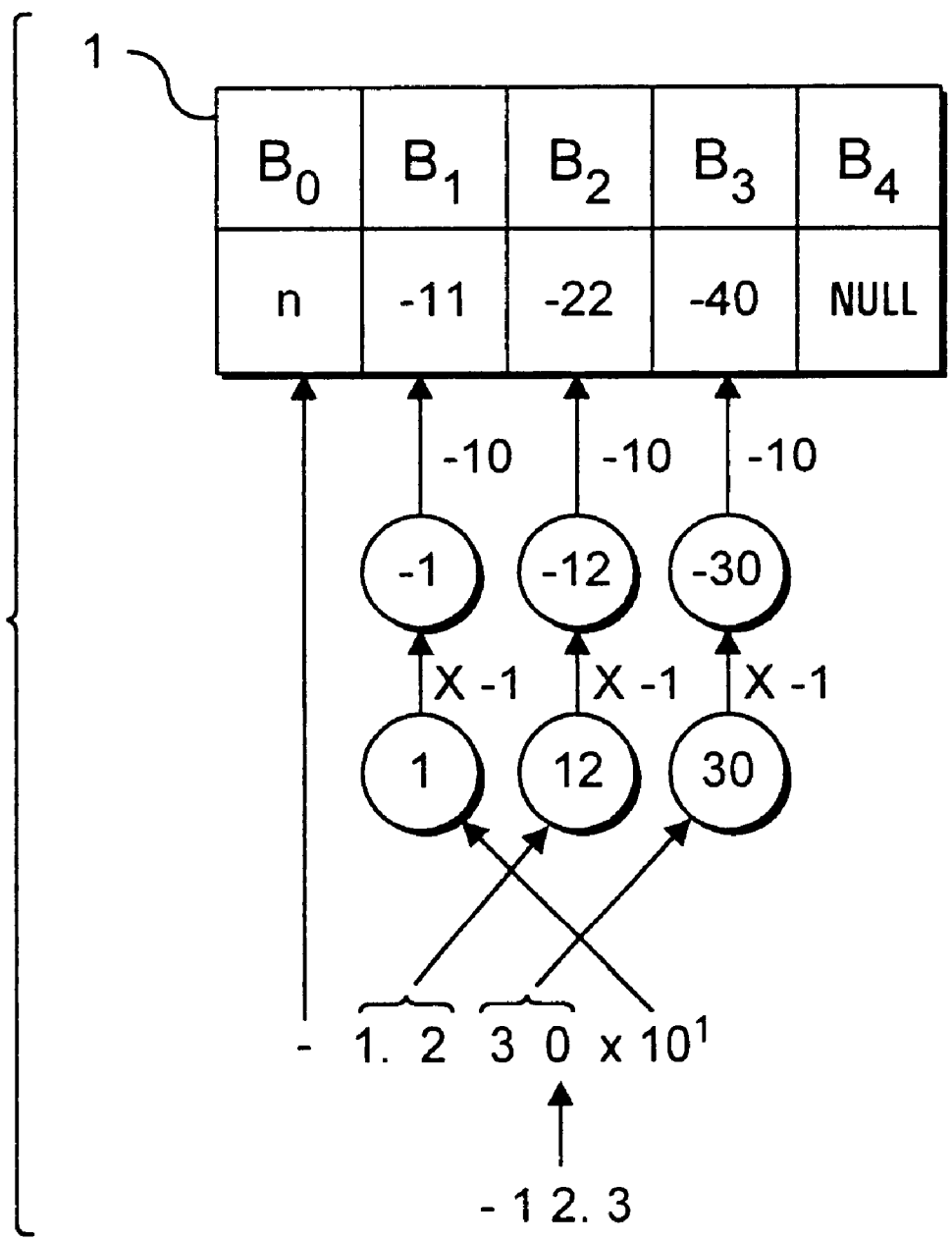
FIG. 5 illustrates the encoding method according to the present invention, wherein the numeric data encoded is a negative number less than −1.

A fourth example of the use of the encoding method of the present invention is shown in FIG. 5, wherein the numeric data is −12.3, or −1.23×$10^1$. As in the third example, the numeric data of the fourth example is negative, and, therefore, 'n' is stored in $B_0$. The exponent is 1, which, when biased by reversing the sign and subtracting 10 (or, equivalently, adding 10 and then reversing the sign), is stored in $B_1$ as −11. The mantissa is segmented in to two groups: 12, 30. The first group, 12, is biased by reversing the sign and subtracting 10 (or equivalently, adding 10 and then reversing the sign) and is stored in $B_2$ as −22; and the second group, 30, is biased by reversing the sign and subtracting 10 (or, equivalently, adding and then reversing the sign) and is stored in $B_3$ as −40. Finally, the NULL terminator is stored in $B_4$. Further examples of encoding negative numbers less than −11 are shown below in Table 5:

| Numeric Data | Encoded Numeric Data |
|---|---|
| −12.3 | "n, −10, −22, −40, NULL" |
| −4.0 | "n, −10, −50, NULL" |
| −4.2 | "n−, −10, −52, NULL" |
| −123 | "n, −12, −22, −40, NULL" |
| −123.456 | "n, −12, −22, −44, −66, NULL" |
| −1234 | "n, −13, −22, −44, NULL" |

A fifth example of the use of the encoding method of the present invention is where the numeric data has a zero value. In such case, "o" is stored in $B_o$ and the NULL terminator is stored in $B_1$.

Finally, a sixth example of the use of the encoding method of the present invention is where the numeric data has a NULL value. The numeric data may have a NULL value if, for example, the value is unknown. In such case, the NULL terminator is stored in $B_0$.

By encoding numeric data according to the encoding method of the present invention, the internal representation of the numeric data is properly collatable. For example, if the numeric data 1, 2, 10 were stored in a memory as simple character strings, the data would collate in the order 1, 10, 2. Similarly, if the numeric data −1, −2, −10 were stored in a memory as simple character strings, this data would collate in the order −1, −10, −2. However, the numeric data encoded according to the present invention collates properly. Table 6, below, illustrates the proper collating of numeric data when encoded according to the present invention:

TABLE 6

| Numeric Data | Internal Representation of Numeric Data | | | | | |
|---|---|---|---|---|---|---|
| | $B_0$ | $B_1$ | $B_2$ | $B_3$ | $B_4$ | $B_5$ |
| NULL | NULL | | | | | |
| −123.456 | n | −12 | −22 | −44 | −66 | NULL |
| −12.3 | n | −11 | −22 | −40 | NULL | |
| −0.439 | n | 11 | −53 | −100 | NULL | |
| −0.0123 | n | 12 | −22 | −40 | NULL | |
| 0 | o | NULL | | | | |
| +0.0123 | p | −12 | 22 | 40 | NULL | |
| +0.439 | p | −11 | 53 | 100 | NULL | |
| +1.234 | p | 10 | 22 | 44 | NULL | |
| +123.456 | p | 12 | 22 | 44 | 66 | NULL |

The numeric data encoded according to the present method, in addition to being properly collatable, may be manipulated by, for example, standard mathematical functions, such as addition, subtraction, multiplication, division, modulo and exponentiation. It should be clear that based on the foregoing, numbers are encoded according to the present method such that there is a single digit to the left of the decimal point. The decimal point is implicit but not actually encoded or otherwise stored. It should also be appreciated that the length of the string that represents the encoded numeric data is commensurate with the precision and scale of the numeric data.

Figure 6:
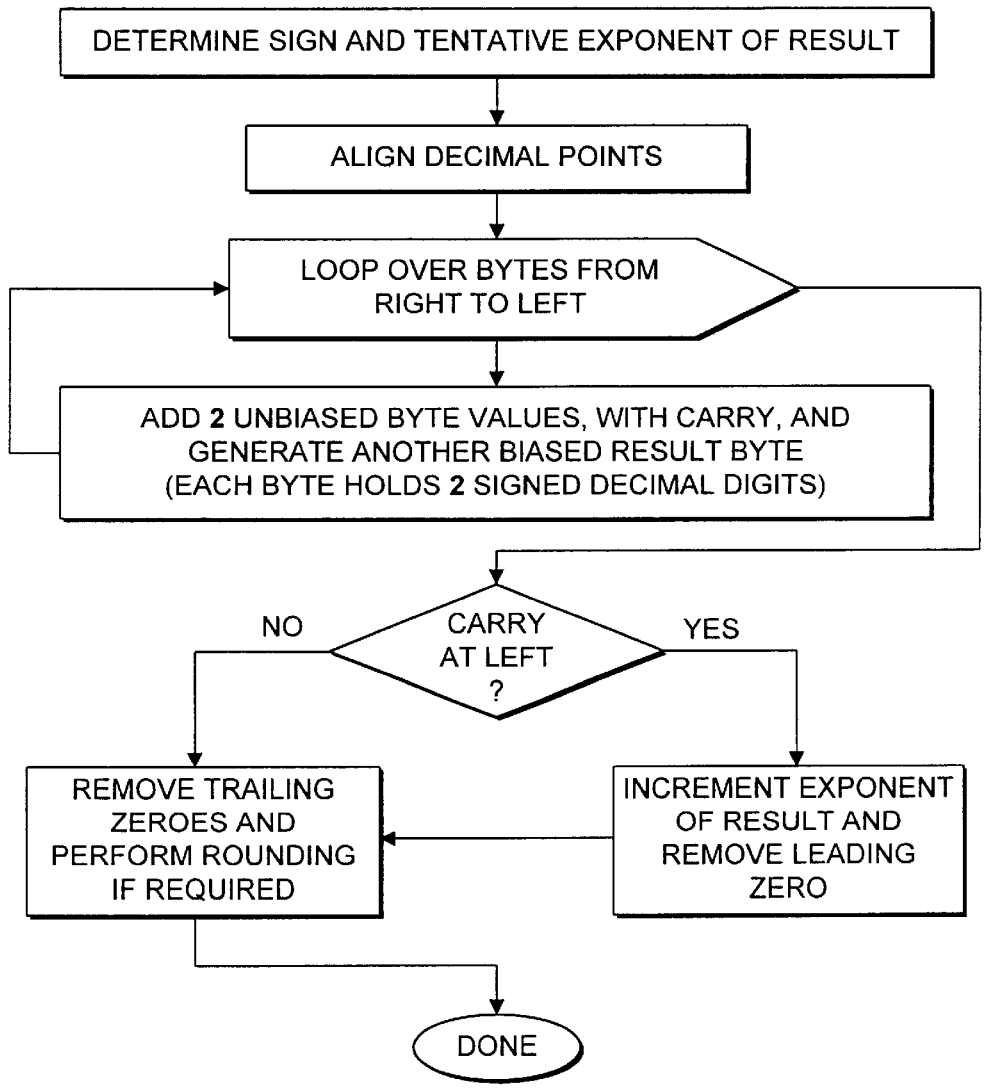
FIG. 6 is a flowchart showing an addition operation of the present invention.

The addition function of the present invention will be described with reference to FIGS. 6 and 7. When adding two encoded numbers, the decimal points of the numbers are aligned by increasing the exponent of the lesser number and logically shifting its mantissa to the right by a corresponding number of digits. It is preferable to maintain a byte offset to avoid an actual shifting. If the difference between the exponents is odd, an additional single-digit shift is performed on the lesser number and a leading zero inserted. An addition is performed on the unbiased values byte-by-byte, i.e. two digits at a time, from the right to the left, with carry, if any and new biased bytes are generated. If a carry is generated at the left-most end, the exponent is incremented by one and a single-digit shift is performed so that the result is in the form n.nnn . . . $\times 10^x$. Finally, trailing zeros, if any are removed and rounding is performed if the scale of the result exceeds the scale of the number being operated upon.

Figure 9:
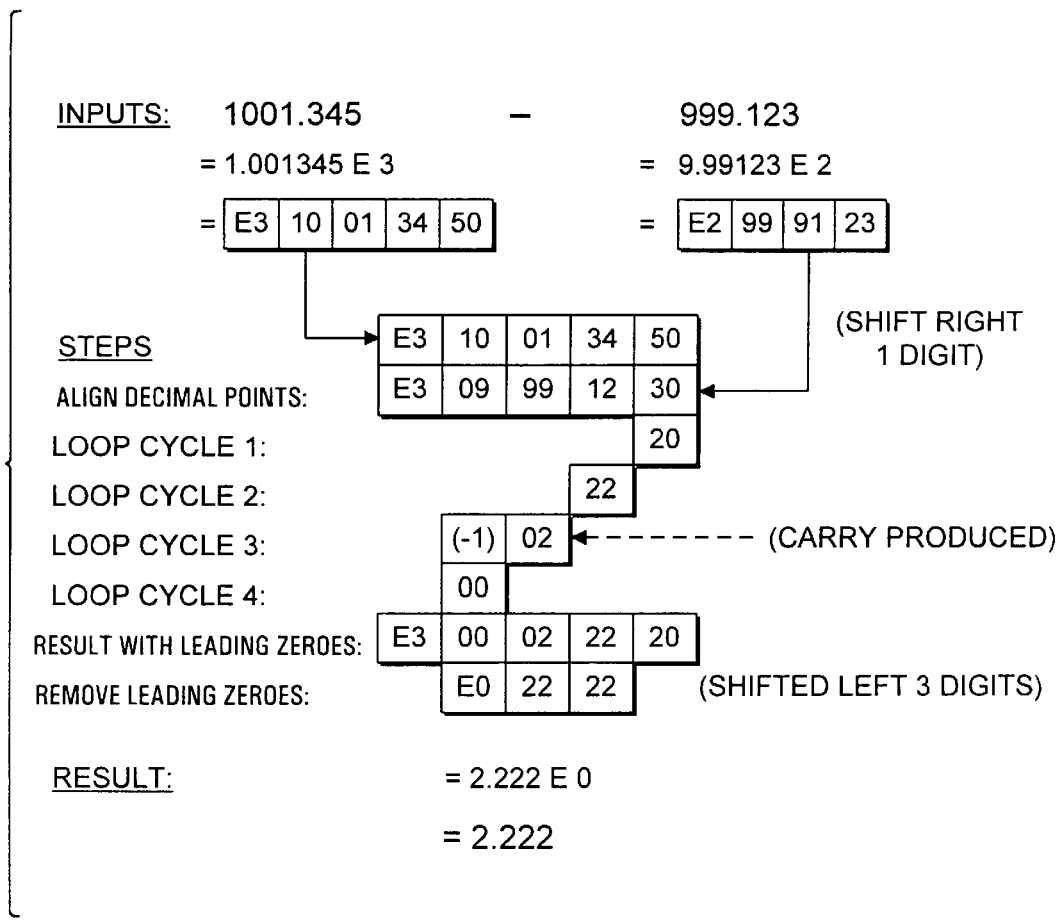
FIG. 9 illustrates the subtraction operation performed on encoded numeric data.

The subtraction function of the present invention will be described with reference to FIG. 8 and 9. First the decimal points are aligned by increasing exponent of the lesser number, in absolute value, and logically shifting its mantissa to the right by the corresponding number of digits. It is preferable to maintain a byte offset to avoid an actual shifting of the data. If the difference between the exponents is odd, an additional single-digit shift is performed. Similar to the addition function, the subtraction function is performed on unbiased values on a byte-by-byte basis from right to left, with carry, if any and generating new biased bytes. Any leading zero digits are removed by shifting the mantissa leftward and correspondingly decrementing the exponent of the result. Finally, trailing zeros, if any, are removed and rounding is performed if the scale of the result exceeds the scale of the number being operated upon.

Figure 10:
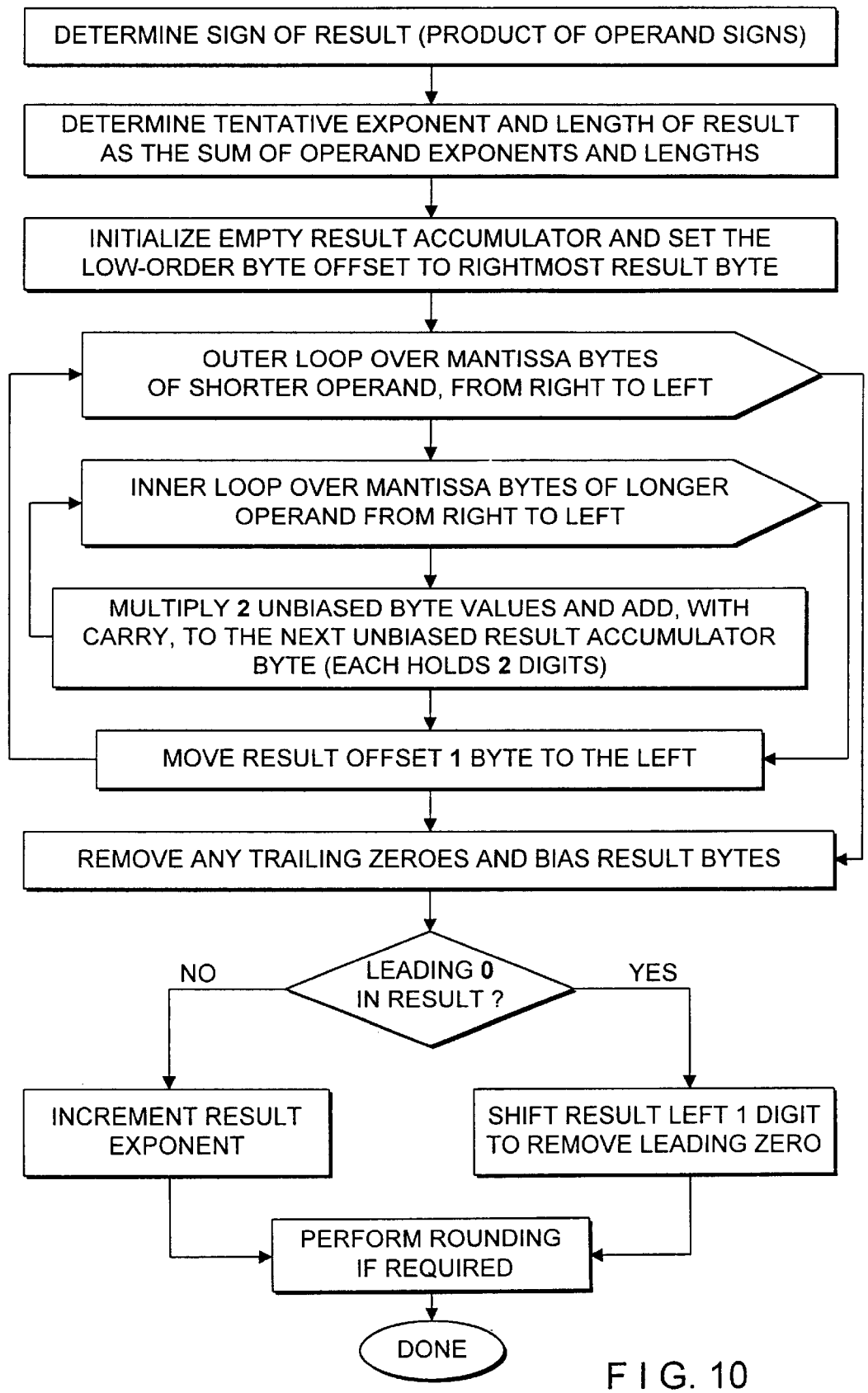
FIG. 10 is a flowchart showing a multiplication operation of the present invention.
Figure 11:
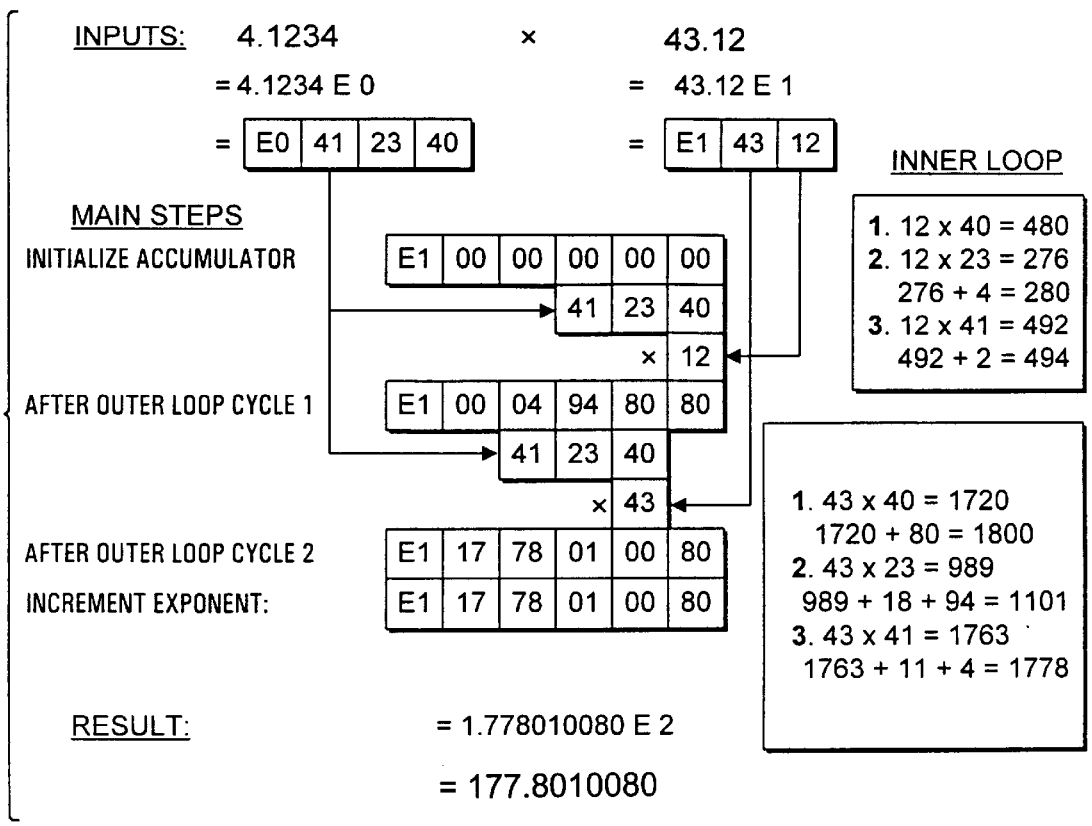
FIG. 11 illustrates the multiplication operation performed on encoded numeric data.

The multiplication function of the present invention will be described with reference to FIG. 10 and 11. First, the sign of the result, its maximum length and the tentative exponent are determined, and a buffer of sufficient size is allocated and initialized with zeros. The buffer is used to accumulate the results of each loop cycle with the unbiased byte values and adds the result to the next result accumulator byte, processing from right to left. Trailing zeros are removed, except for a final zero if necessary to fill out the last full byte. If the result accumulator contains a leading zero, the mantissa is shifted to the left by a single digit. Rounding is performed if the scale of the result exceeds the scale of the number being operated upon.

Figure 12:
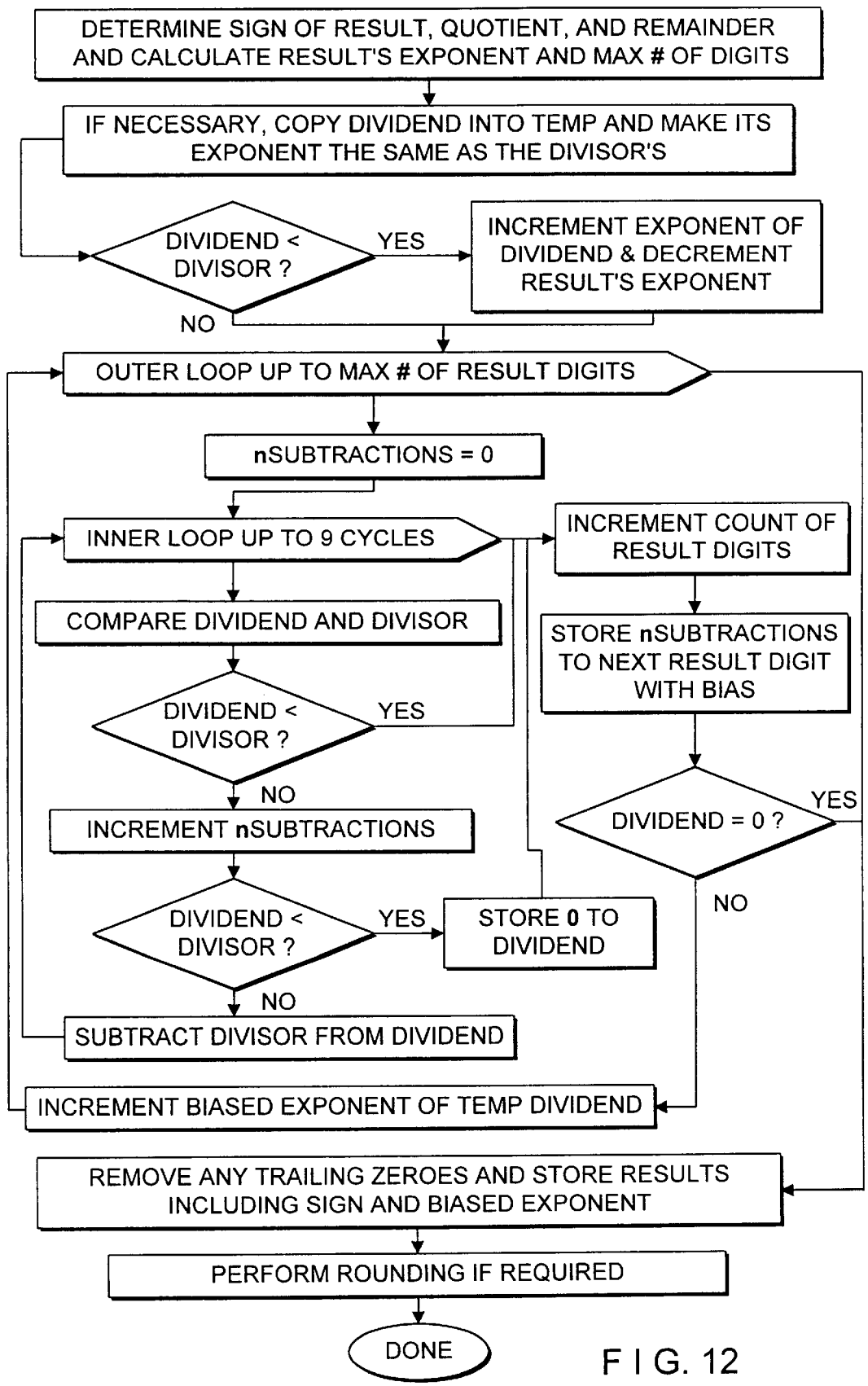
FIG. 12 is a flowchart showing a division operation of the present invention.

The division function of the present invention will be described with reference to FIGS. 12 and 13. The signs of the result, quotient and remainder are first determined based on the operands. The sign of the result and quotient are positive if the operands have the same sign. If the operands have opposite signs, the result and quotient are negative. The sign or the remainder is always the sign of the dividend, i.e. the number being operated upon. The exponent of the result is calculated as the difference between the exponent of the dividend and the divisor. A maximum number of mantissa digits for the result is calculated by adding the exponent of the result, an allowance for a scale factor plus an extra digit to support proper rounding to the desired scale. A result accumulator of sufficient length is allocated and the dividend copied into this temporary variable, which will be used as the remaining dividend. The exponent of the temporary dividend is then adjusted to be the same as that of the divisor. If the dividend is then smaller than the divisor, the exponent of the dividend is incremented and the exponent of the result decremented. A main loop generates one mantissa digit per cycle, filling the result accumulator from left to right. Each result digit is computed by an inner loop that subtracts the divisor from the dividend, until the absolute value of the remaining dividend is less than the divisor. The number of subtractions performed by the inner loop yields the next digit of the result. If the remainder is zero, the outer loop terminates. Otherwise, the remaining dividend is multiplied by ten and processing for the next digit of the result continues, up to the required scale and precision. Trailing zeros are removed, except for a last zero if necessary to fill out a last full byte. A final rounding is performed only if the scale of the result exceeds the scale of the number being operated upon.

A modulo operation follows the same operation as the division operation, except that the calculation is completed when then numerator becomes less than the denominator. The numerator, which is the modulo or remainder, is the result of the calculation.

Exponentiation is performed substantially according to the multiplication operation described above, with certain special cases. First, if the power is zero, the result is 1, because $x^0=1$ for all values of x. Second, if the number to be raised to a power is zero, the result is zero because $0^x=0$ for all values of x. The third special case is $x^{-y}$. The operation is performed on the equivalent $(1/x)^{+y}$. Exponentiation is performed using the multiplication operation according to the "Binary Method" technique, where the multiplication operation is performed in a loop wherein the power is used as the loop index. For each iteration, the loop index is divided by 2 and the loop is exited when the loop index becomes 1 (less than 2). During each iteration, the number is squared, i.e. multiplied by itself. If the loop index is an odd value, an "extra" multiplication is performed.

It should be appreciated that although the present invention has been described hereinabove with reference to software operations, the invention also may be embodied in hardware, such as in a multi-purpose or special-purpose computer or component thereof.

Thus, the several aforementioned objects and advantages are most effectively attained. Although a single preferred embodiment of the invention has been disclosed and described in detail herein, it should be understood that this invention is in no sense limited thereby and that numerous modifications may be made without departing from its spirit and scope, which is to be determined by that of the appended claims.

What is claimed is:

1. A method of encoding numeric data, said method comprising the steps of:
   determining a sign of said numeric data;
   determining an exponent of said numeric data;
   determining a mantissa of said numeric data;
   segmenting said mantissa determined by said mantissa determining step into at least one group of at least one digit;
   storing a representation of said sign determined by said sign determining step in a first memory location;
   storing a representation of said exponent determined by said exponent determining step in a second memory location; and
   storing a representation of each of said at least one group of at least one digits segmented by said segmenting step in a respective memory location.

2. The method according to claim 1, further comprising a step of storing a termination data in a third memory location.

3. The method according to claim 1, wherein said sign determining step comprises a step of determining whether a value of said numeric data is zero, said sign representation storing step storing in said first memory location a representation indicative that said value of said numeric data is a zero value.

4. The method according to claim 1, wherein said sign determining step comprises a step of determining whether a value of said numeric data is a null value, said sign representation storing step storing in said first memory location a representation indicative that said value of said numeric data is a null value.

5. The method according to claim 1, wherein a first sign value is stored in said first memory if said numeric date is positive and a second sign value is stored in said first memory if said numeric data is negative.

6. The method according to claim 5, wherein said first sign value is greater than said second sign value.

7. The method according to claim 5, wherein a third sign value is stored in said first memory if said numeric data is zero.

8. The method according to claim 7, wherein said first sign value is greater than said third sign value and wherein said third sign value is greater than said second sign value.

9. The method according claim 8, wherein said second sign value, said third sign value and said first sign value represent respective characters in alphabetical order.

10. The method according claim 9, wherein said second sign value is representative of the character "n," said third sign value is representative of the character "o" and said first sign value is representative of the character "p."

11. The method according to claim 1, wherein each of said at least one group of at least one digit comprises a predetermined length of digits.

12. The method according to claim 11, wherein said predetermined length of digits is two digits.

13. The method according to claim 1, further comprising a step of biasing said exponent determined by said exponent determining step, said representation of said exponent stored in said second memory location being a representation of said biased exponent.

14. The method according to claim 1, further comprising a step of biasing each of said at least one group of at least one digit, said representation of each of said at least one group of at least one digits being a representation of said biased group of at least one digit.

15. The method according to claim 2, wherein said termination data is a NULL byte.

16. The method according to claim 1, wherein said representation of said exponent is a character representation of said exponent.

17. The method according to claim 1, wherein each of said representation of said at least one group of digits is a character representation of said group of at least one digit.

18. The method according to claim 16, wherein said character representation comprises a single character.

19. The method according to claim 17, wherein each character representation comprises a single character.

20. The method according to claim 19, wherein each group of at least one digit consists of two digits.

21. The method according to claim 1, further comprising a step of performing an addition operation on said encoded numeric data.

22. The method according to claim 1, further comprising a step of performing a subtraction operation on said encoded numeric data.

23. The method according to claim 1, further comprising a step of performing a multiplication operation on said encoded numeric data.

24. The method according to claim 1, further comprising a step of performing a division operation on said encoded numeric data.

25. The method according to claim 1, further comprising a step of performing an exponentiation operation on said encoded numeric data.

26. The method according to claim 1, further comprising a step of performing a modulo operation on said encoded numeric data.

27. The method according to claim 1, wherein said numeric data is stored by said storing steps as a variable-length, NULL-terminated character string.

28. The method according to claim 27, wherein said length of said character string corresponds to a precision of said numeric data.

29. The method according to claim 27, wherein said NULL-terminated character string comprises, in order, said representation of said sign, said representation of said exponent, said representation of each of said group of at least one digit and a NULL terminator.

30. A computer system, comprising:
   a memory;
   an input device;
   an output device; and
   a method of encoding numeric data, said method comprising the steps of:
      determining a sign of said numeric data;
      determining an exponent of said numeric data;
      determining a mantissa of said numeric data;
      segmenting said mantissa determined by said mantissa determining step into at least one group of at least one digit;
      storing a representation of said sign determined by said sign determining step in a first memory location;
      storing a representation of said exponent determined by said exponent determining step in a second memory location; and
      storing a representation of each of said at least one group of at least one digits segmented by said segmenting step in a respective memory location.

31. The computer system according to claim 30, wherein said method further comprises a step of storing a termination data in a third memory location.

32. The computer system according to claim 30, wherein said sign determining step comprises a step of determining whether a value of said numeric data is zero, said sign representation storing step storing in said first memory location a representation indicative that said value of said numeric data is a zero value.

33. The computer system according to claim 30, wherein said sign determining step comprises a step of determining whether a value of said numeric data is a null value, said sign representation storing step storing in said first memory location a representation indicative that said value of said numeric data is a null value.

34. The computer system according to claim 30, wherein a first sign value is stored in said first memory if said numeric date is positive and a second sign value is stored in said first memory if said numeric data is negative.

35. The computer system according to claim 34, wherein said first sign value is greater than said second sign value.

36. The computer system according to claim 34, wherein a third sign value is stored in said first memory if said numeric data is zero.

37. The computer system according to claim 36, wherein said first sign value is greater than said third sign value and wherein said third sign value is greater than said second sign value.

38. The computer system according to claim 37, wherein said second sign value, said third sign value and said first sign value represent respective characters in alphabetical order.

39. The computer system according to claim 38, wherein said second sign value is representative of the character "n," said third sign value is representative of the character "o" and said first sign value is representative of the character "p."

40. The computer system according to claim 30, wherein each of said at least one group of at least one digit comprises a predetermined length of digits.

41. The computer system according to claim 40, wherein said predetermined length of digits is two digits.

42. The computer system according to claim 30, wherein said method further comprises a step of biasing said exponent determined by said exponent determining step, said representation of said exponent stored in said second memory location being a representation of said biased exponent.

43. The computer system according to claim 30, wherein said method further comprises a step of biasing each of said at least one group of at least one digit, said representation of each of said at least one group of at least one digits being a representation of said biased group of at least one digit.

44. The computer system according to claim 31, wherein said termination data is a NULL byte.

45. The computer system according to claim 30, wherein said representation of said exponent is a character representation of said exponent.

46. The computer system according to claim 30, wherein each of said representation of said at least one group of digits is a character representation of said group of at least one digit.

47. The computer system according to claim 45, wherein said character representation comprises a single character.

48. The computer system according to claim 46, wherein each character representation comprises a single character.

49. The computer system according to claim 48, wherein each group of at least one digit consists of two digits.

50. The computer system according to claim 30, wherein said method further comprises a step of performing an addition operation on said encoded numeric data.

51. The computer system according to claim 30, wherein said method further comprises a step of performing a subtraction operation on said encoded numeric data.

52. The computer system according to claim 30, wherein said method further comprises a step of performing a multiplication operation on said encoded numeric data.

53. The computer system according to claim 30, wherein said method further comprises a step of performing a division operation on said encoded numeric data.

54. The computer system according to claim 30, wherein said method further comprises a step of performing an exponentiation operation on said encoded numeric data.

55. The computer system according to claim 30, wherein said method further comprises a step of performing a modulo operation on said encoded numeric data.

56. The computer system according to claim 30, wherein said numeric data is stored by said storing steps as a variable-length, NULL-terminated character string.

57. The computer system according to claim 56, wherein said length of said character string corresponds to a precision of said numeric data.

58. The computer system according to claim 56, wherein said NULL-terminated character string comprises, in order, said representation of said sign, said representation of said exponent, said representation of each of said group of at least one digit and a NULL terminator.

59. A computer readable medium for a computer program, said computer readable medium comprising a computer program providing a method of encoding numeric data, said method comprising the steps of:
   determining a sign of said numeric data;
   determining an exponent of said numeric data;
   determining a mantissa of said numeric data;

segmenting said mantissa determined by said mantissa determining step into at least one group of at least one digit;

storing a representation of said sign determined by said sign determining step in a first memory location;

storing a representation of said exponent determined by said exponent determining step in a second memory location; and storing a representation of each of said at least one group of at least one digits segmented by said segmenting step in a respective memory location.

60. The computer readable medium according to claim 59, wherein said method further comprises a step of storing a termination data in a third memory location.

61. The computer readable medium according to claim 59, wherein said sign determining step comprises a step of determining whether a value of said numeric data is zero, said sign representation storing step storing in said first memory location a representation indicative that said value of said numeric data is a zero value.

62. The computer readable medium according to claim 59, wherein said sign determining step comprises a step of determining whether a value of said numeric data is a null value, said sign representation storing step storing in said first memory location a representation indicative that said value of said numeric data is a null value.

63. The computer readable medium according to claim 59, wherein a first sign value is stored in said first memory if said numeric date is positive and a second sign value is stored in said first memory if said numeric data is negative.

64. The computer readable medium according to claim 63, wherein said first sign value is greater than said second sign value.

65. The computer readable medium according to claim 63, wherein a third sign value is stored in said first memory if said numeric data is zero.

66. The computer readable medium according to claim 65, wherein said first sign value is greater than said third sign value and wherein said third sign value is greater than said second sign value.

67. The computer readable medium according to claim 66, wherein said second sign value, said third sign value and said first sign value represent respective characters in alphabetical order.

68. The computer readable medium according to claim 67, wherein said second sign value is representative of the character "n," said third sign value is representative of the character "o" and said first sign value is representative of the character "p."

69. The computer readable medium according to claim 59, wherein each of said at least one group of at least one digit comprises a predetermined length of digits.

70. The computer readable medium according to claim 69, wherein said predetermined length of digits is two digits.

71. The computer readable medium according to claim 59, wherein said method further comprises a step of biasing said exponent determined by said exponent determining step, said representation of said exponent stored in said second memory location being a representation of said biased exponent.

72. The computer readable medium according to claim 59, wherein said method further comprises a step of biasing each of said at least one group of at least one digit, said representation of each of said at least one group of at least one digits being a representation of said biased group of at least one digit.

73. The computer readable medium according to claim 60, wherein said termination data is a NULL byte.

74. The computer readable medium according to claim 59, wherein said representation of said exponent is a character representation of said exponent.

75. The computer readable medium according to claim 59, wherein each of said representation of said at least one group of digits is a character representation of said group of at least one digit.

76. The computer readable medium according to claim 74, wherein said character representation comprises a single character.

77. The computer readable medium according to claim 75, wherein each character representation comprises a single character.

78. The computer readable medium according to claim 77, wherein each group of at least one digit consists of two digits.

79. The computer readable medium according to claim 59, wherein said method further comprises a step of performing an addition operation on said encoded numeric data.

80. The computer readable medium according to claim 59, wherein said method further comprises a step of performing a subtraction operation on said encoded numeric data.

81. The computer readable medium according to claim 59, wherein said method further comprises a step of performing a multiplication operation on said encoded numeric data.

82. The computer readable medium according to claim 59, wherein said method further comprises a step of performing a division operation on said encoded numeric data.

83. The computer readable medium according to claim 59, wherein said method further comprises a step of performing an exponentiation operation on said encoded numeric data.

84. The computer readable medium according to claim 59, wherein said method further comprises a step of performing a modulo operation on said encoded numeric data.

85. The computer readable medium according to claim 59, wherein said numeric data is stored by said storing steps as a variable-length, NULL-terminated character string.

86. The computer readable medium according to claim 85, wherein said length of said character string corresponds to a precision of said numeric data.

87. The computer readable medium according to claim 85, wherein said NULL-terminated character string comprises, in order, said representation of said sign, said representation of said exponent, said representation of each of said group of at least one digit and a NULL terminator.

* * * * *